United States Patent [19]
Givens et al.

[11] Patent Number: 5,894,169
[45] Date of Patent: *Apr. 13, 1999

[54] LOW-LEAKAGE BORDERLESS CONTACTS TO DOPED REGIONS

[75] Inventors: John Howard Givens; Charles William Koburger, III; Jerome Brett Lasky, all of Essex Junction, Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/698,672

[22] Filed: Aug. 16, 1996

Related U.S. Application Data

[62] Division of application No. 08/417,326, Apr. 5, 1995, Pat. No. 5,605,862.

[51] Int. Cl.⁶ .................. H01L 23/48; H01L 23/52; H01L 29/40
[52] U.S. Cl. .................. 257/774; 257/382; 257/751; 257/754
[58] Field of Search .................. 257/774, 751, 257/754, 756, 763, 192, 382, 377, 764; 437/189, 191, 195, 533, 561, 621, 618, 647, 657

[56] References Cited

U.S. PATENT DOCUMENTS

| | | | |
|---|---|---|---|
| 3,859,127 | 1/1975 | Lehner | 117/212 |
| 4,086,613 | 4/1978 | Biet et al. | 257/905 |
| 4,433,468 | 2/1984 | Kawamata | 437/189 |
| 4,512,073 | 4/1985 | Hsu | 257/771 |
| 4,549,914 | 10/1985 | Oh | 438/533 |
| 4,666,556 | 5/1987 | Fulton | 156/643 |
| 4,676,847 | 6/1987 | Lin | 148/188 |
| 4,818,723 | 4/1989 | Yen | 437/200 |
| 4,833,516 | 5/1989 | Hwang et al. | 257/302 |
| 4,912,540 | 3/1990 | Sander et al. | 257/774 |
| 5,202,279 | 4/1993 | Chung | 437/47 |
| 5,236,867 | 8/1993 | Furuta et al. | 437/195 |
| 5,244,835 | 9/1993 | Hachiya | 437/191 |
| 5,252,517 | 10/1993 | Blalock | 437/195 |
| 5,323,046 | 6/1994 | Ema et al. | 257/774 |
| 5,408,130 | 4/1995 | Woo et al. | 257/774 |
| 5,426,326 | 6/1995 | Ohyu et al. | 257/327 |
| 5,466,971 | 11/1995 | Higuchi | 257/763 |
| 5,479,048 | 12/1995 | Yallup et al. | 257/774 |

OTHER PUBLICATIONS

Givens et, "A Low–Temperature Local Interconnect Process In a 0.25μM–Channel CMOS Logic Technology With Shallow Trench Isolation", IBM Microelectronics Division, Jun. 7–8, 1994.

Clarence W. Teng, Christopher Slawinski and William R. Hunter, *Defect Generation in Trench Isolation*, Addenda to BU893–0045 Searches.

*Primary Examiner*—Olik Chaudhuri
*Assistant Examiner*—Phat X. Cao
*Attorney, Agent, or Firm*—Heslin & Rothenberg, P.C.; Jeff Rothenberg, Esq.; Mark Chadurjian, Esq.

[57] ABSTRACT

A semiconductor device having low-leakage borderless contacts is formed by etching contact openings adjacent first and second electronic elements of opposite dopant type, conformally depositing a thin doped polysilicon layer, protecting the electronic element of similar dopant-type, removing the thin doped polysilicon layer adjacent the oppositely doped electronic element diffusing dopant from said polysilicon layer into a side wall of the electronic element of similar dopant-type, and then depositing tungsten within the contact openings.

5 Claims, 11 Drawing Sheets

LOW-LEAKAGE BORDERLESS CONTACTS TO DOPED REGIONS

This application is a division of application Ser. No. 08/417,326 filed Apr. 5, 1995 which application is now: U.S. Pat. No. 5,605,862.

FIELD OF THE INVENTION

The present invention relates to the process of making semiconductor devices having low-leakage contacts. More particularly, the present invention relates to semiconductor devices, and methods of preparing the same, having low-leakage contacts to doped electronic elements.

BACKGROUND

In the fabrication of integrated circuits (IC), individual semiconductor devices and electronic elements formed within the semiconductor substrate must in turn be connected with one or more metallization levels. These metallization levels form the desired inter-connections between the individual electronic elements and also the connections to outside leads. Typically, an individual electronic element is coupled to a metallization level via a stud or contact which extends through a passivation layer and physically contacts both the metallization level and the electronic element.

However, due to extremely high device densities incorporated within many of today's integrated circuits the method of forming the metallization contacts must be compatible with an ever increasing variety of structures and devices. For example, many CMOS structures often employ borderless diffusion regions adjacent isolation regions. These isolation regions commonly employ a shallow trench insulation (STI) structure which may be filled with a dielectric material such as silicon oxide. With such a structure the goal of metallization contact (MC) etching is to uniformly expose the contact area of the diffusion regions while etching a minimum of the STI fill. Although fill erosion may be seduced by increasing the etch selectivity between the passivation layer and an etch stop, it is still necessary for the process to utilize an over-etch in order to guarantee opening of all MC to diffusion contact areas. Thus, this etching process commonly causes erosion of the STI fill and exposure of a lightly doped region of the semiconductor substrate within the diffusion. Moreover, it should be noted that in addition to MC etching, other steps such as pad and sacrificial oxide strips, spacer etching, salicide pre-cleans and other processes also contribute to fill pulldown and exposure of lightly doped regions of electronic elements.

Exposure of the lightly doped semiconductor substrate of electronic elements, such as diffusions, is undesirable since electrical coupling of the same with the metallization contact often causes "leaky" contacts. In this regard the dopant concentration of the semiconductor substrate affects the work function of the semiconductor material and it is the work function of this material in relation to the work function of the material comprising the metallization contact that will determine the contact properties. Typically, coupling of a highly doped semiconductor material with a low resistance contact, such as a metal, results in good low-leakage contacts. However, coupling of a lightly doped semiconductor substrate and a metal often results in a poor contact and is, therefore, undesirable.

Similarly caused leakage problems in other integrated circuits have been avoided by having deeper junctions. However, due to the large variety of IC designs and their corresponding device densities, utilization of deeper junctions is often not an option. For example, a deep junction immediately adjacent to a gate may often create adverse affects on FET device behavior. Devices utilizing a thin gate electrode (e.g. 200 nM) often experience local threshold fluctuations when higher energy implants are channeled through the thin polysilicon layer in order to form the deeper junctions. Alternatively, using a faster diffusing species for achieving greater junction depth is similarly limited since implants do not diffuse in a completely vertical fashion and junctions of an opposite donor type are commonly adjacent these junctions. Thus long diffusions are often insupportable, particularly in high density devices.

Utilization of oxide or nitride spacers inside the metallization contact-holes has been suggested. However, preliminary attempts at employing such a strategy has meet with poor success since shallow trench isolation corners are not repeatedly and sufficiently vertical and anisotropy of etches is degraded in small crevices. Another attempted solution is adding appropriately masked implants after contact hole etching, where appropriate dopant species are implanted into unfilled empty holes. However, activation of the dopants within salicide diffusions and other electronic elements then becomes difficult since the implant energies needed to effect such implants must be substantial and the ions must penetrate vertically through the silicon at least as far as the maximum pulldown depths.

Therefore, there exists a need for semiconductor devices and a process for making the same which provide low-leakage borderless contacts between metallization levels and doped electronic elements. There further exists a need for such a process that utilizes techniques compatible with a wide variety of pre-existing electronic elements and semiconductor structures. Further, there exits a need for such a process which does not utilize techniques or incorporate structures which will significantly increase either the surface area or height occupied by the device.

SUMMARY OF THE INVENTION

The aforesaid needs are fulfilled and the problems of the prior art overcome by the present invention which in one aspect includes a process for selectively forming layers of material comprising the steps of:

providing a substrate having first and second openings, said first and second openings exposing respective first and second electronic elements;

depositing a first layer within said first and second openings adjacent said first and second electronic elements;

protecting the first layer adjacent said first electronic element and removing said first layer from adjacent said second electronic element;

de-protecting the first layer adjacent said first electronic element; and depositing a material within said first and second openings.

The above process may be further characterized wherein said first layer is a dopant source chosen from the group consisting of doped polysilicon and doped oxide and wherein the first electronic element has a lightly doped region exposed by the first opening. In addition, the process may further comprise the step of diffusing dopant from said first layer into said first electronic element.

The above process may also comprise depositing a second layer adjacent said second electronic element after removing said first layer from adjacent said second electronic element and before de-protecting the first layer adjacent said first electronic element. The first layer may have a dopant similar to that of said first electronic element and the second layer a dopant similar to that of said second electronic element. As used herein "protecting" electronic elements means employing a mask or layer of protective material over the exposed portions of the electronic element which protect the electronic element from subsequent processing steps, examples of such protective materials being resists, silicon oxide, silicon nitride and other materials known in the art. "De-protecting" as used herein means removing the mask or layer of protective material from over the electronic element.

In a further aspect the invention may include a process for selectively forming layers of material comprising the steps of:

provided a semiconductor device having first and second openings, said first and second openings exposing respective first and second electronic elements;

depositing a protective layer in said first and second openings;

selectively removing said protective layer adjacent said first electronic element;

depositing a first dopant layer adjacent said device;

selectively protecting said first electronic element wherein said first dopant layer adjacent said second electronic element remains exposed;

removing the exposed first dopant layer and the provisional layer adjacent said second electronic element;

de-protecting said first electronic element; and depositing a material within said first and second openings.

In a further aspect the invention may be characterized as a semiconductor device having a low leakage contact comprising:

a semiconductor substrate having first and second electronic elements, said first electronic element having a lightly doped region;

a passivation layer over said semiconductor substrate, said passivation layer having a via adjacent said first and second electronic elements filled with a conductive material;

a first dopant layer having a similar dopant-type as said first electronic element, said dopant layer positioned within said via between said doped regions of the first electronic element and said conductive material.

DESCRIPTION OF THE INVENTION

It is common for silicon substrates used in integrated circuits today to incorporate numerous doped regions of opposite donor types, namely substrates incorporating both n-type and p-type doped regions. These doped regions may comprise part of the many individual electronic elements within the semiconductor substrate which are in turn interconnected via one or more metallization layers and their respective metallization contacts. However, as discussed hereinabove, in order for the device to function efficiently it is important that these metallization contacts create reliable low-leakage connection points.

Figure 1:
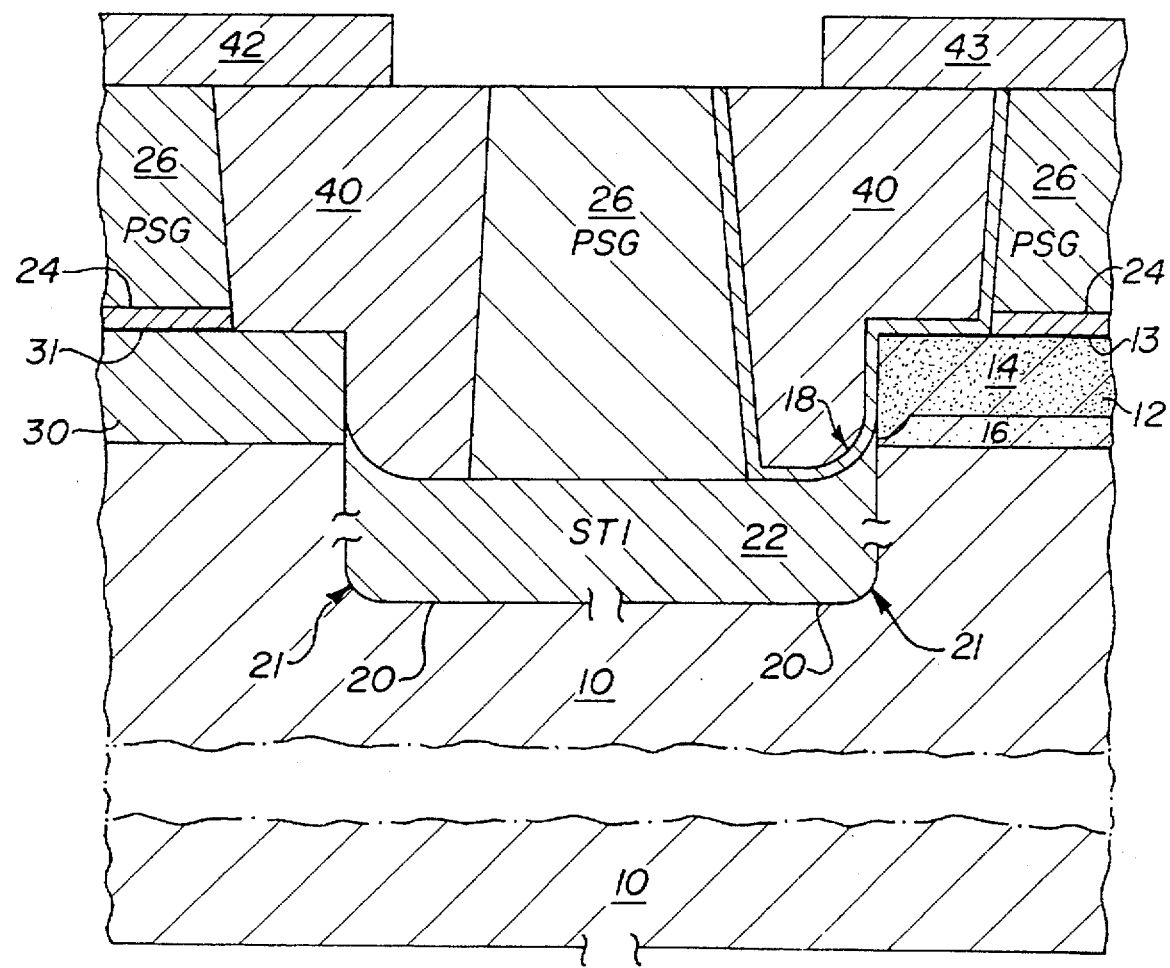
FIG. 1 is a cross-sectional side view of a low-leakage contact between a doped diffusion region and a metallization layer.

An example of such a low leakage contact may be seen with reference to FIG. 1. Within the semiconductor substrate 10 exists a first electronic element 12, for example a borderless diffusion comprising a salicided 13 (self-aligned silicide) doped silicon region. As used herein the term "electronic element" may refer to both active electronic devices and passive electronic components. Within the doped electronic element 12 are highly doped areas 14 and lightly doped areas 16. Adjacent the diffusion may be an isolation structure 20, an example being a shallow trench 21 having a dielectric fill 22. The semiconductor substrate may further incorporate an electronic element 30 within a distant portion of the semiconductor substrate. Both of the electronic elements may in turn be insulated by a passivation layer 26. A thin dopant layer 18 remains over the first electronic element 12 which is of a similar dopant type. Conductive material deposited within the contact openings form the metallization contacts 40. Patterned metallization layers 42 and 43 formed over the planarized structure lie in contact with the metallization contacts 40 providing the desired inter-connections within the device.

Although the structure discussed above has been shown with reference to a particular embodiment it will be readily apparent to one skilled in the art that the process discussed herein may be used as a means for providing stable low-leakage contacts with other semiconductor devices. In addition, it should be noted that the drawings do not show additional electronic elements within the semiconductor substrate, and although such additional elements are intended to be incorporated within the semiconductor substrate they have not been shown so as to more clearly describe and show the present invention.

The method of fabricating a semiconductor device having a low-leakage borderless contact, such as one employing a borderless diffusion junction, is discussed hereinbelow with reference to FIGS. 2–8. As seen in reference to FIG. 2, the process of the present invention may begin once the desired electronic elements 12 and 30 are formed within the semiconductor substrate. A first electronic element 12 such as a diffusion region comprising a self-aligned layer of titanium silicide 13 over either n+ doped or p+ doped silicon has been formed in the semiconductor substrate by means well known in the art. The doped silicon, which may be formed by ion implantation, will have a dopant concentration that decreases with depth. Thus, the doped electronic element will have a highly doped region 14 and a lightly doped region 16.

As used herein a highly doped silicon region is a region having a dopant concentration in excess of about $1 \times 10^{19}/cm^3$ whereas a lightly doped silicon region is a region having a dopant concentration below about $1 \times 10^{19}/cm^3$.

Figure 2:
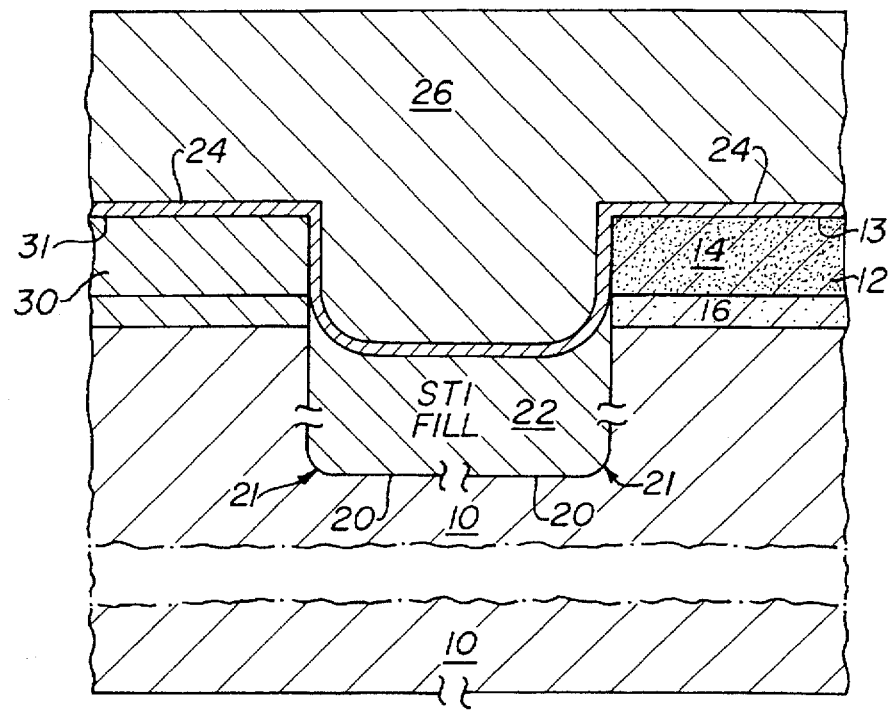
FIGS. 2–8 represent cross-sectional side views of structures formed in the fabrication of the device of FIG. 1.

Adjacent the doped electronic element 12 may be an isolation structure 20 such as an STI trench 21 having a dielectric fill 22. Commonly the dielectric fill will comprise silicon oxide. In addition, located in a distant portion of the semiconductor substrate is a second electronic element 30 which may be of an opposite dopant type. For example, if the first electronic element comprises an n-type diffusion region, the second electronic element 30 may comprise a p+ diffusion region. As shown in FIG. 2, electronic element 30 may also comprise a diffusion region having a self-aligned layer of titanium silicide 31 over doped silicon. Once the desired electronic elements have been created, and activated as necessary, an etch stop 24, such as a layer of silicon nitride, may be deposited over the semiconductor device. Thereafter, a passivation layer 26 may be formed over the etch stop 24 and semiconductor substrate 10. An example of a preferred passivation layer is phosphosilicate glass (PSG) of about 6000Å although other standard passivation materials may likewise be utilized.

Figure 3:
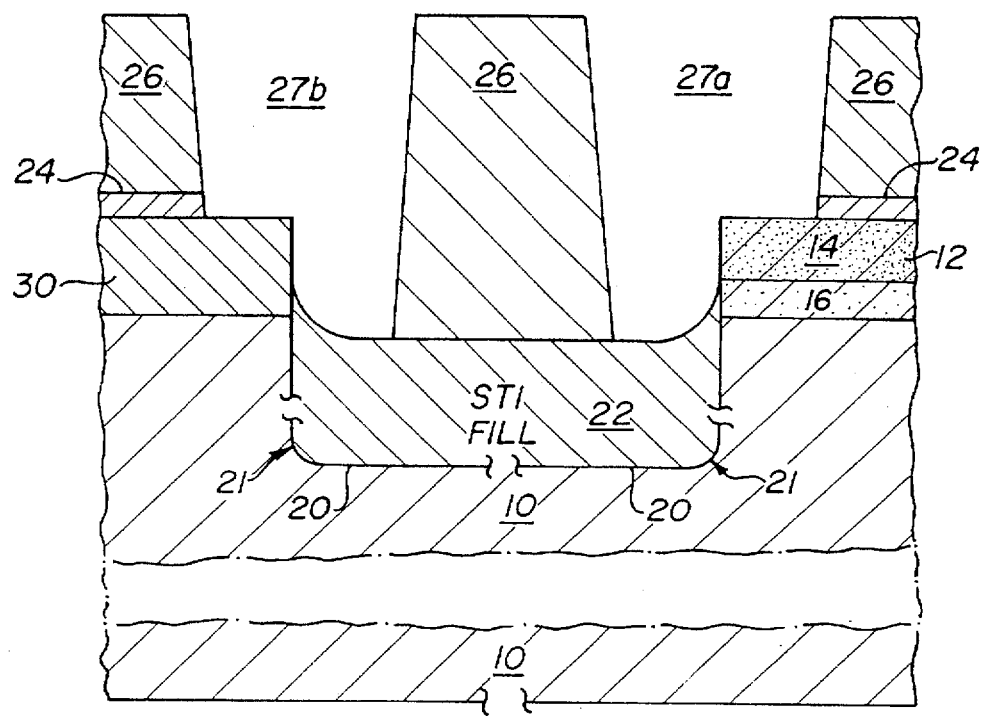

A photoresist (not shown) may then be applied over the passivation layer 26 and patterned in order to leave exposed those portions of the passivation layer over the first and second electronic elements 12 and 30. The exposed portion of the passivation layer 26 may then be removed to create the contact openings 27a and 27b as shown in FIG. 3. Preferably the contact openings 27 are created with an etch that selectively etches the passivation layer 26 relative to the etch stop 24. Upon reaching the etch stop 24 etching chemistries may be changed in order to apply an etch that selectively etches the etch stop, e.g. a silicon nitride layer, relative to those materials comprising the electronic element, e.g. titanium silicide and doped silicon. Such selective etches are known in the art, and an example of such a selective etch is described in the article *Selective Dry Etching In a high Density Plasma for O.S. μm Complementary Metal-Oxide Semiconductor Technology, J. Vac. Sci. Technol. B.* Vol. 12, No. 1, Jan/Feb. 1994. The resulting contact holes 27 expose the electronic elements 12 and 30 intended to be electrically coupled to a metallization layer.

It should be noted that formation of the contact holes 27 may further reduce the depth of the dielectric fill 22 within the shallow trench adjacent the diffusion and thereby expose a portion of the lightly doped region 16 of electronic element 12. However, it is also possible that the oxide fill may have been previously eroded below this level by prior fabrication steps.

Figure 4:
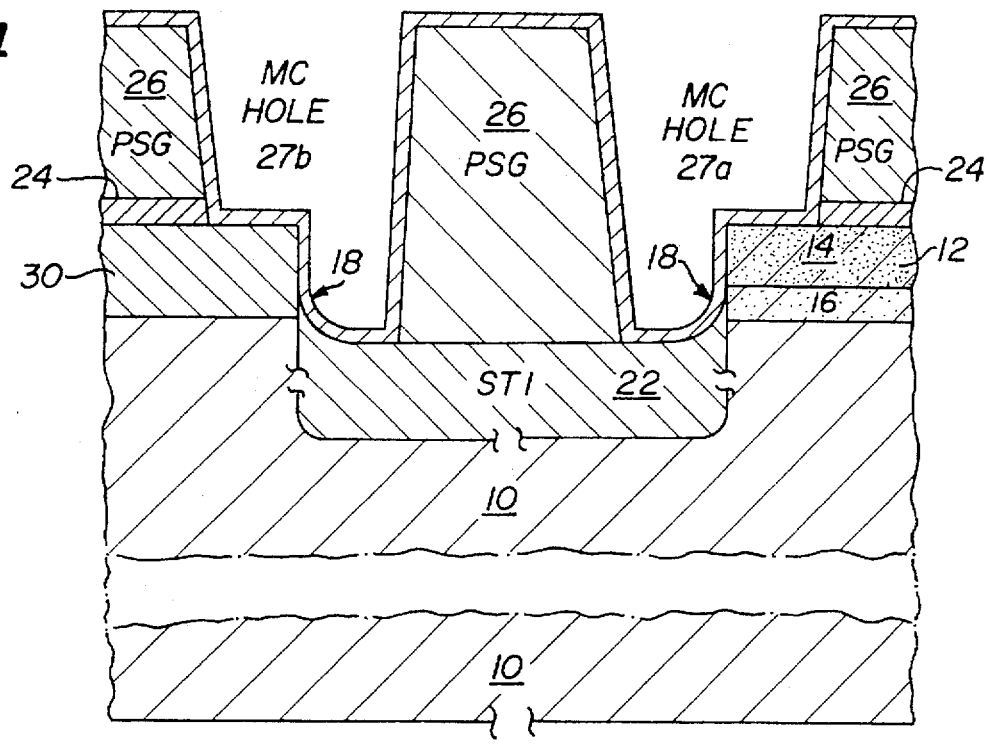

As may be seen in reference to FIG. 4, a first dopant layer 18 may then be conformally deposited over the semiconductor device, and particularly within the contact openings 27a and 27b over electronic elements 12 and 30. The dopant layer 18 may be deposited by means well known in the art such as chemical vapor deposition. This first dopant layer 18 may comprise highly doped materials such as doped polysilicon or oxide, preferably highly doped n+ polysilicon or highly doped p+ polysilicon. Although, numerous n-type and p-type dopants are known and capable of use in the present invention, phosphorous and boron respectively are preferred dopants. In the present example, if the first electronic element 12 is an n-doped silicon electronic element, the dopant layer 18 will likewise be n-doped.

When using an n+ type dopant material the first dopant layer may comprise a thin layer of n+ doped polysilicon having a thickness of approximately 250Å–1000Å, and preferably about 500Å. The dopant concentration of the dopant layer should be at least $2 \times 10^{19}/cm^3$ and preferably between $1 \times 10^{20}/cm^3$ to $1 \times 10^{21}/cm^3$. When using a p-type dopant material, the first dopant layer may comprise a thin layer of p+ doped polysilicon having a similar thickness and dopant concentration.

Figure 5:
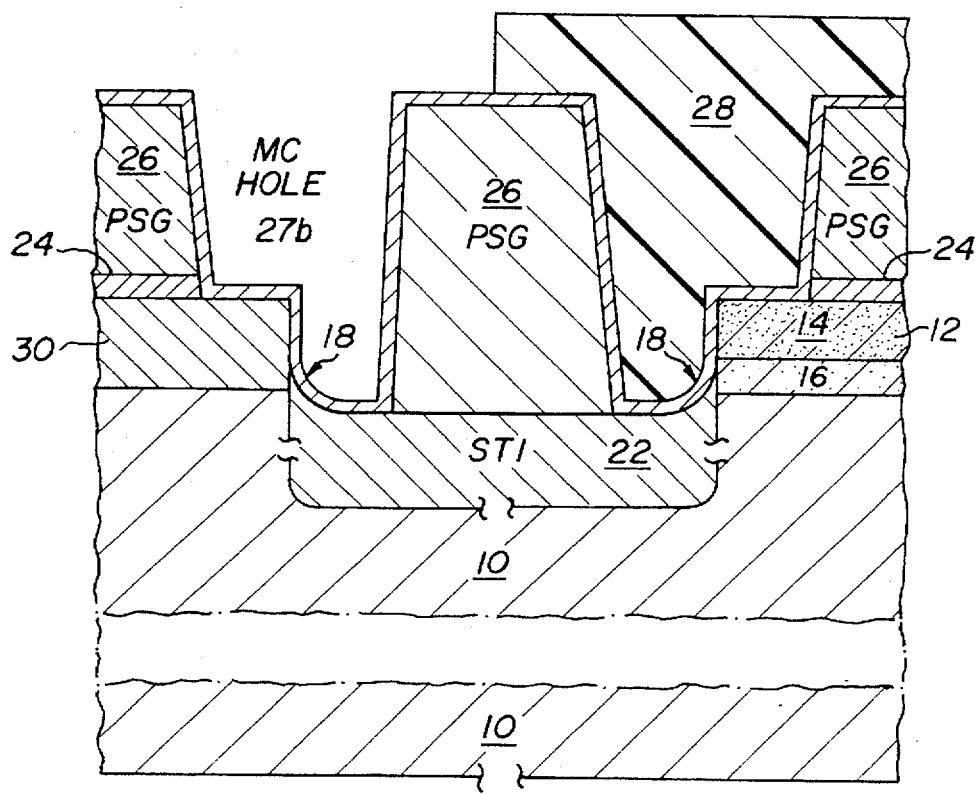
Figure 6:
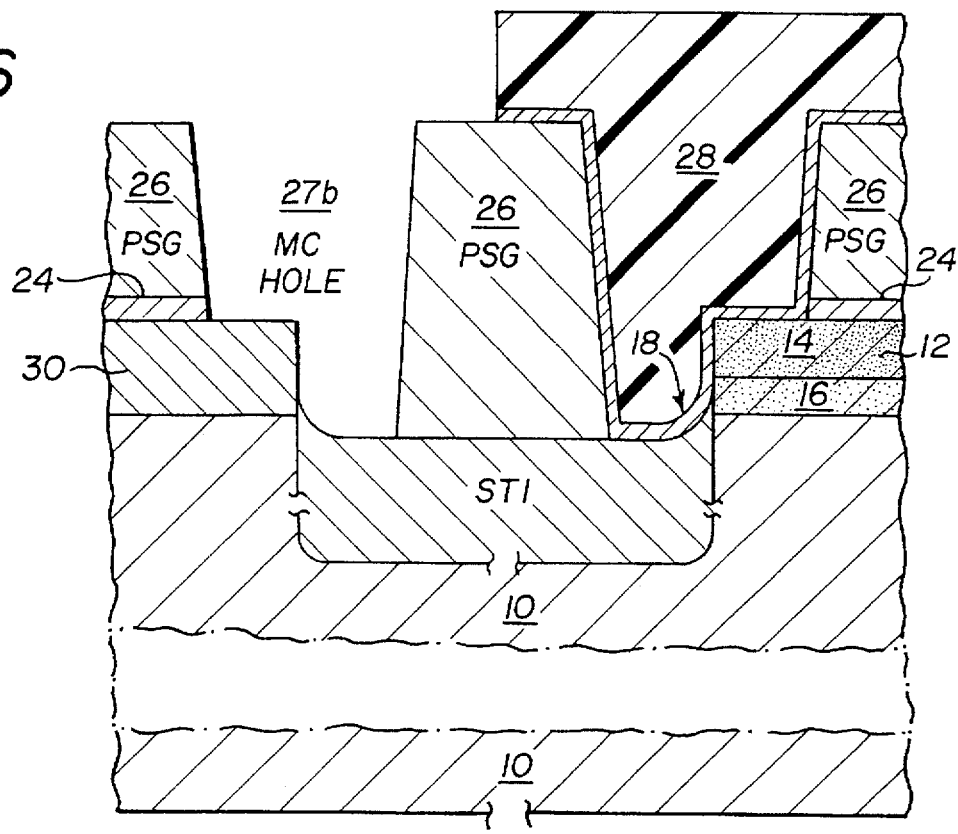

As may be seen with reference to FIG. 5, a masking layer 28, such as a photoresist, may then be applied over the semiconductor device, exposed and developed in order to selectively protect the first electronic element 12. Patterning the masking layer 28 in this manner will leave exposed contact opening 27b and the first dopant layer 18 adjacent the second electronic element 30. The unprotected portion of the first dopant layer 18 adjacent the second electronic element 30 may be removed, resulting in the structure shown in FIG. 6. Although it may only be necessary to remove the dopant layer 18 from adjacent the second electronic element 30, it is preferable to simply remove the dopant layer 18 from within the entire unprotected contact opening 27b. The dopant layer may be removed with a chemical etch, such as a KOH/alcohol etch. Other etching chemistries, such as ethylenediamine-pyrocatechol pyrazine (EDP), which are compatible with the masking layer 28 and capable of removing the thin dopant layer 18 may likewise be utilized in the process of the present invention.

Figure 7:
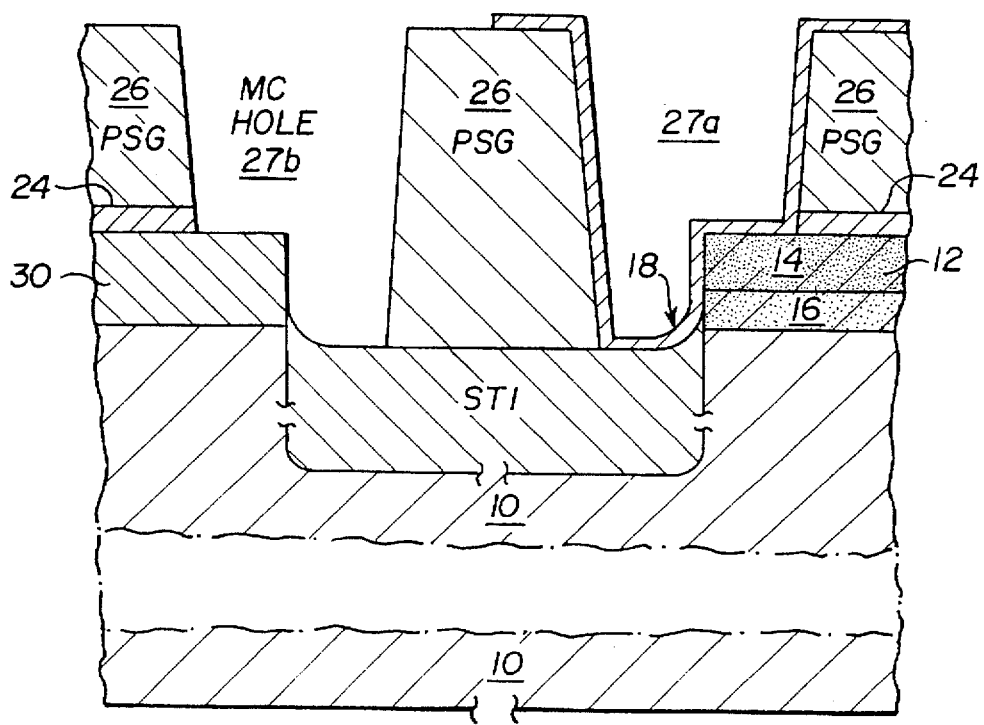

After removing the unprotected portions of the first dopant layer 18, the masking layer 28 may be removed by means well known in the art, resulting in the structure shown in FIG. 7. Portions of the thin dopant layer 18 remaining upon the passivation layer 26 may be removed by CMP or other means prior to subsequent annealing steps discussed below.

Figure 8:
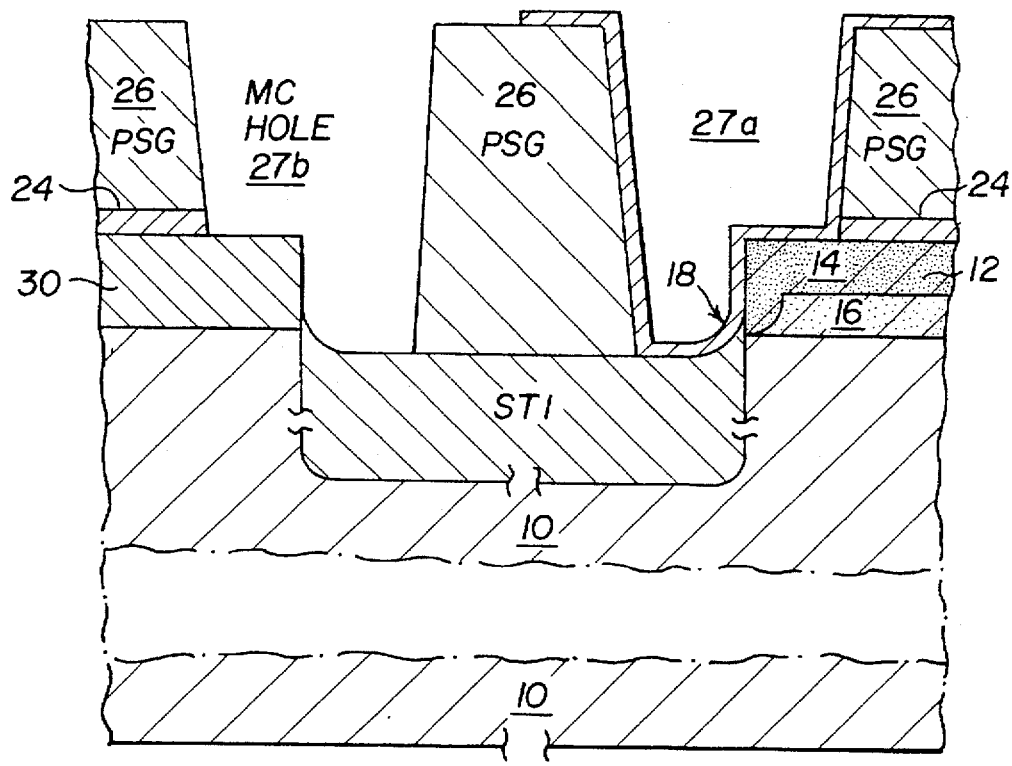

Referring to FIG. 8, dopant from within the first thin dopant layer 18 may then be diffused into the lightly doped regions 16 of the electronic element 12 by an annealing cycle. Referring to FIGS. 7 and 8, by comparing lightly doped region 16 in each of the two drawings it will be understood that dopant molecules diffuse from dopant layer 18 into the lightly doped region 16 exposed by the MC hole. This prevents portions of the lightly doped region 16 from coming in direct electrical contact with the metallization contact 40 and effectively prevents the formation of a leaky MC connection point. Examples of such an annealing cycle include, but are not limited to, heating the semiconductor substrate in a furnace at 600–750° C. for 20–30 minutes, preferably at 600° C. for 30 minutes. Alternatively the annealing cycle may comprise a short RTA (rapid thermal anneal) cycle such as heating the semiconductor substrate at 850–900° C. for about 5 seconds. It should be noted that due to the thinness of the first dopant layer 18 and the low temperatures and short processing time needed to activate the same, pre-existing electronic elements within the semiconductor substrate will experience little alteration or additional diffusion of dopants. However, dopant molecules will diffuse from the first dopant layer 18 into the lightly doped regions 16 of the first electronic element 12.

For example, when the first electronic element 12 is an n-type diffusion, n-type dopant from the first dopant layer 18 will diffuse into the lightly doped region 16 adjacent the first dopant layer 18. This dopant layer 18 in combination with the diffusion of additional dopant into the exposed lightly doped region 16 insures that all doped contact areas will have a sufficiently high dopant concentration to provide good contacts and prevent undesirable leaky MC connection points.

As seen in reference to FIGS. 8 and 1, after activation of the first dopant layer 18, a conductive material may be deposited within the contact openings 27 in order to form the metallization contacts 40 which electrically connect electriconic elements 12 and 30 with a metallization level. Deposition of the conductive material within the contact openings may be accomplished by means well known in the art; for example tungsten may be deposited within the openings by chemical vapor deposition with excess tungsten being removed by chemical-mechanical polishing (CMP). In addition, the remaining portions of the first thin dopant layer 18 over the passivation layer 26 may be similarly removed by CMP. Utilizing CMP in this manner also acts to form a substantially planar surface upon which metallization layers 42 and 43 may be readily formed by means well known in the art. Typically aluminum will be deposited by chemical vapor deposition over a patterned semiconductor device in order to form the desired metallization patterns.

Figure 9:
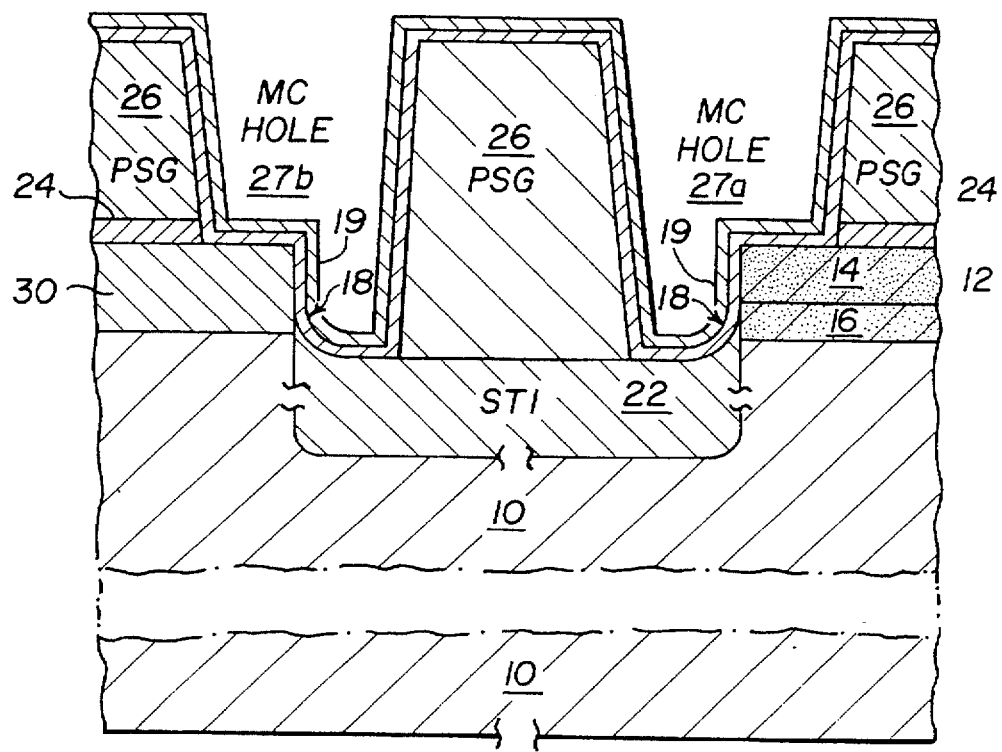
FIGS. 9–12 represent cross-sectional side views of structures formed in the fabrication by an alternative approach of the device of FIG. 1.

An alternative embodiment of the process discussed above may be utilized in relation to protecting the first electronic element 12. This particular embodiment may be employed when the solvent or etch used to selectively remove portions of the dopant layer 18 are not sufficiently compatible with the masking layer 28. Starting with the structure shown in FIG. 4, after depositing the first thin dopant layer 18 a protective layer 19 may be conformally deposited over the device, the resulting structure being shown in FIG. 9. This protective layer 19 will protect the first dopant layer 18 from the solvents or etches used to selectively remove this same dopant layer from other contact openings. Preferably the protective layer 19 comprises a material that may be selectively removed or etched relative to the dopant layer 18, an example being a layer of silicon nitride having a thickness of 250 to 700Å. Alternatively, silicon oxide, may likewise be used to form protective layer 19.

Figure 10:
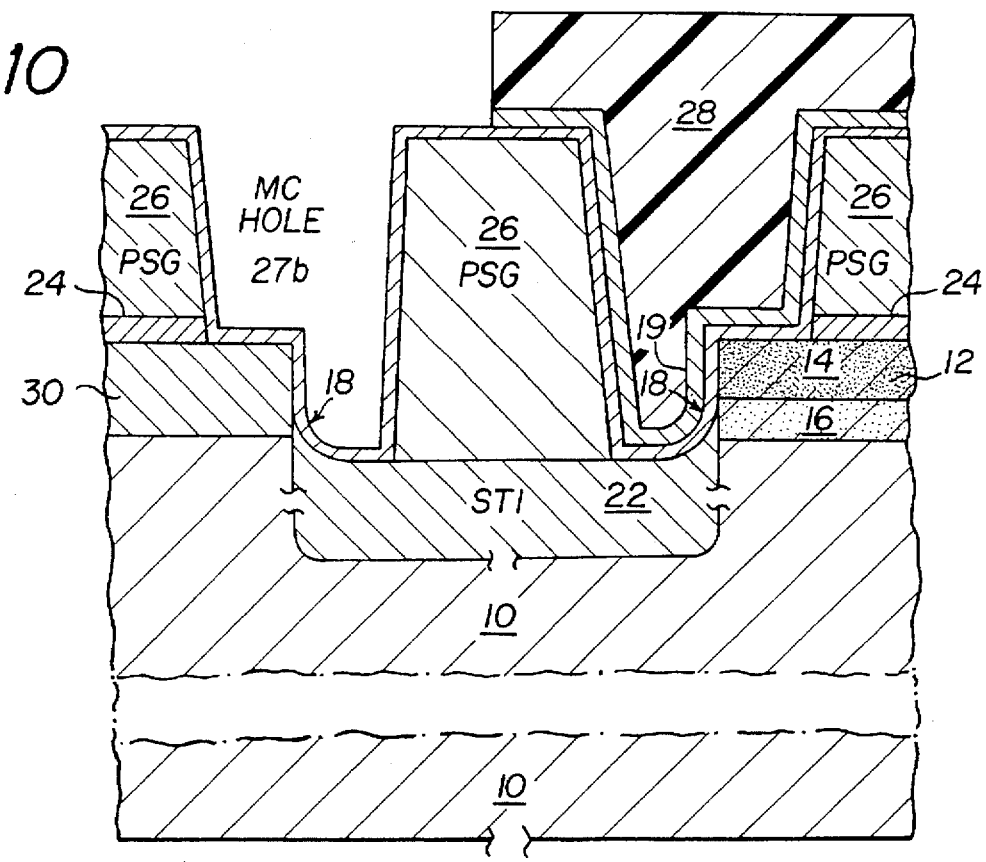
Figure 11:
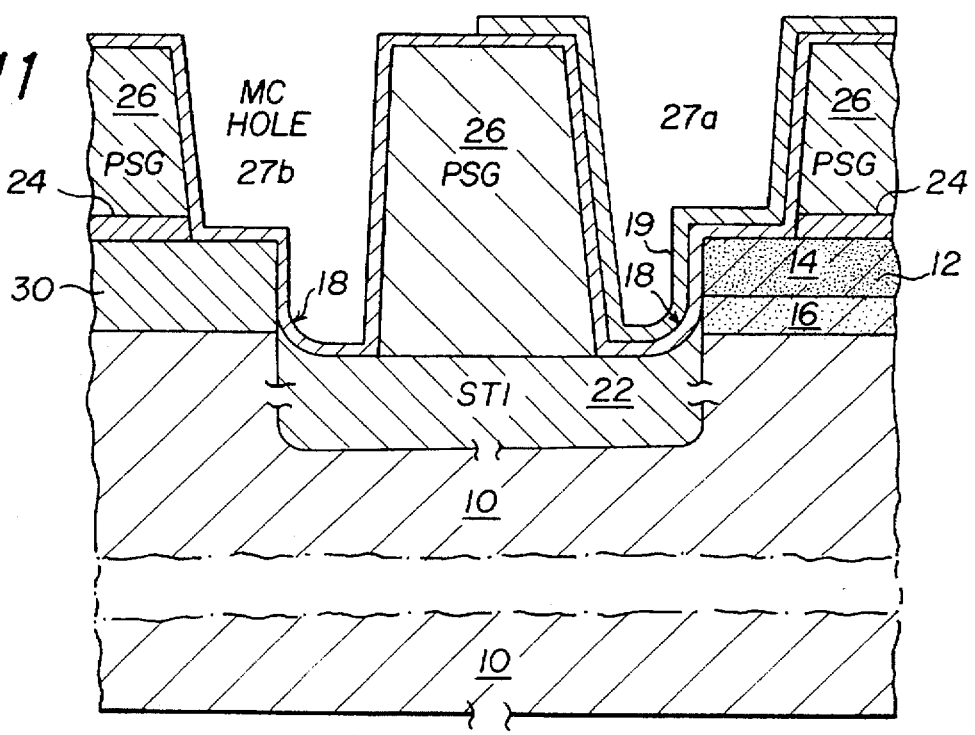
Figure 12:
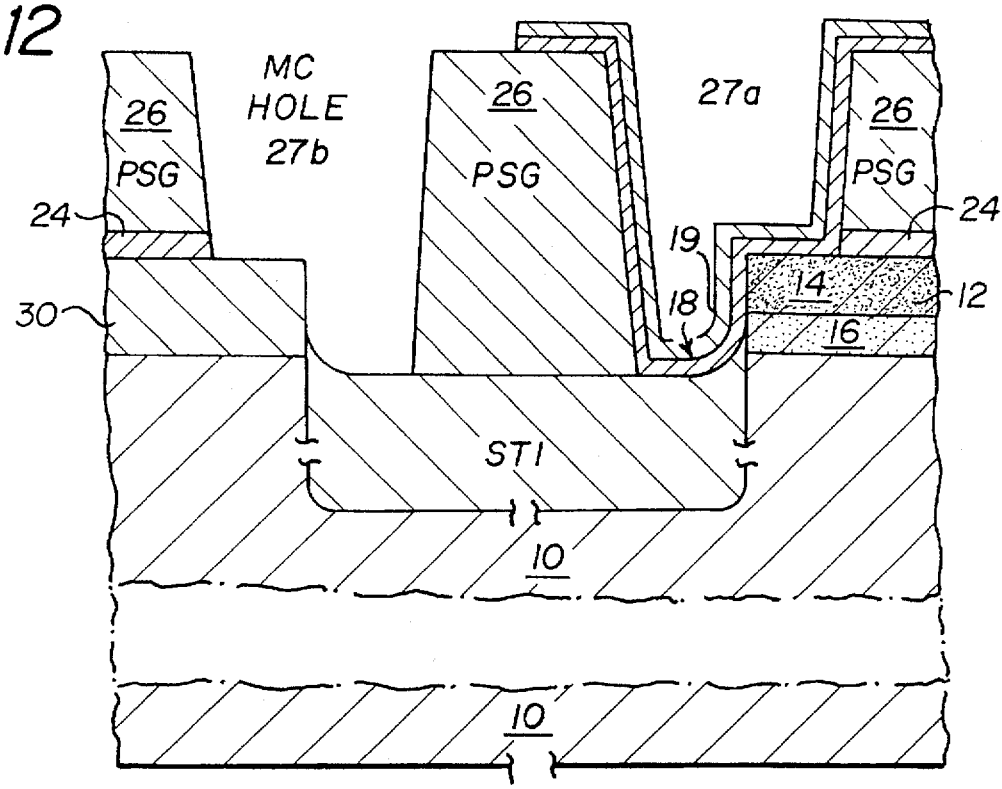

In reference to FIG. 10, masking layer 28, such as a photoresist, may then be applied and patterned in order to selectively protect the first electronic element 12 and expose the contact opening 27b and protective layer 19 over the second electronic element 30. The exposed protective layer 19 may then be removed, preferably utilizing an etch that selectively etches the protective layer 19 relative to dopant layer 18. Removing the exposed protective layer 19 will in turn expose those portions of the first dopant layer 18 adjacent the second electronic element 30. Masking layer 28 may then be removed which leaves protective layer 19 remaining over the dopant layer 18 adjacent the first electronic element 12, as shown in FIG. 11. Referring to FIG. 12, the exposed dopant layer 18 may then be selectively removed from adjacent the second electronic element 30 as discussed hereinabove since protective layer 19 prevents removal of the dopant layer 18 from adjacent the first electronic element 12. A selective etch may then be applied to remove the remaining portion of the protective layer 19, resulting in the structure shown in FIG. 7. Activation of the first dopant layer 18 and formation of the contacts and metallization layers may then be accomplished as discussed above.

Figure 13:
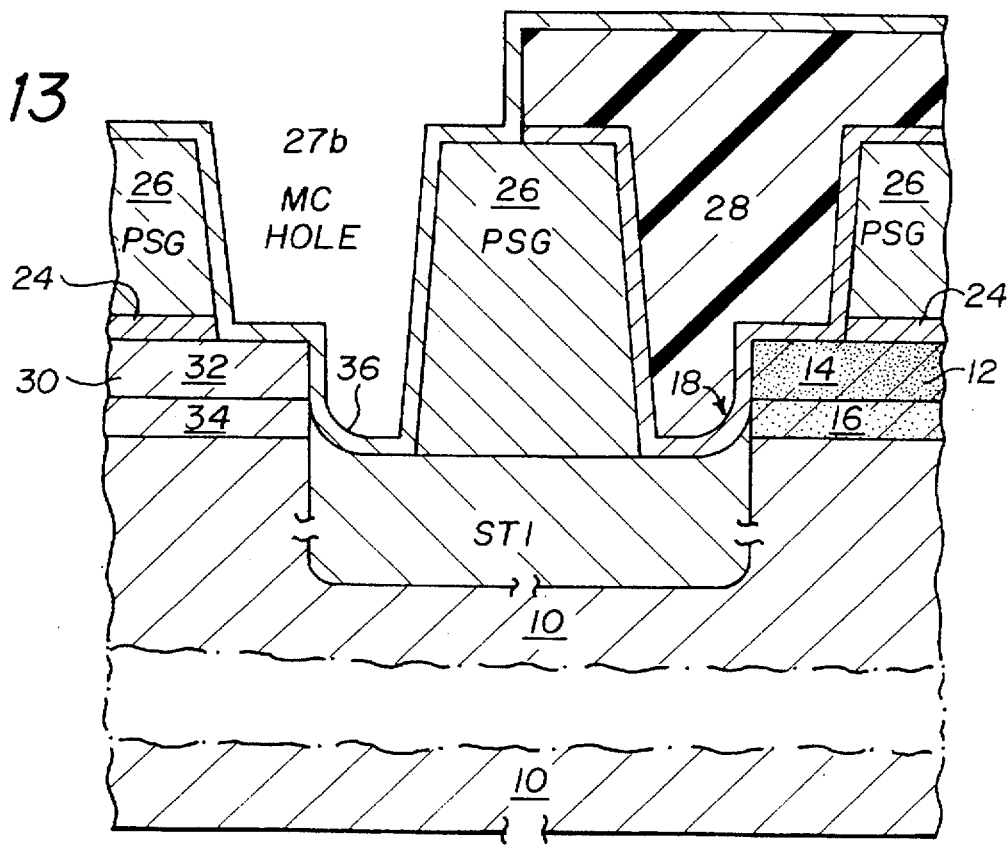
FIGS. 13–14 represent cross-sectional side views of structures formed at various stages in the fabrication of the device of FIG. 15.
Figure 14:
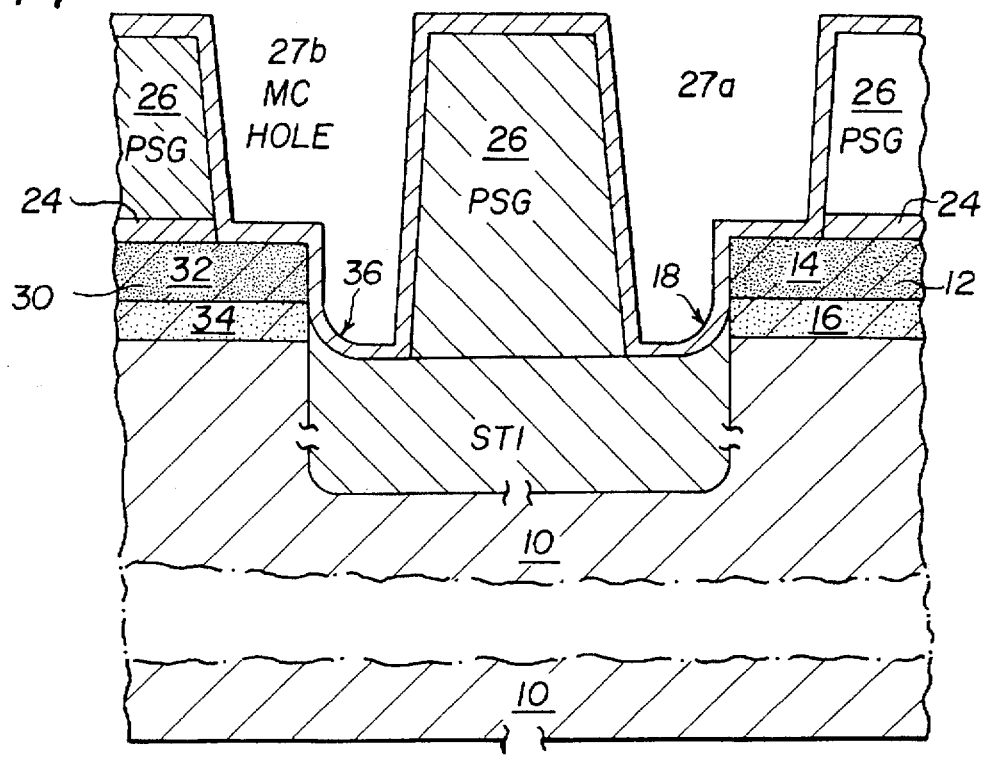
Figure 15:
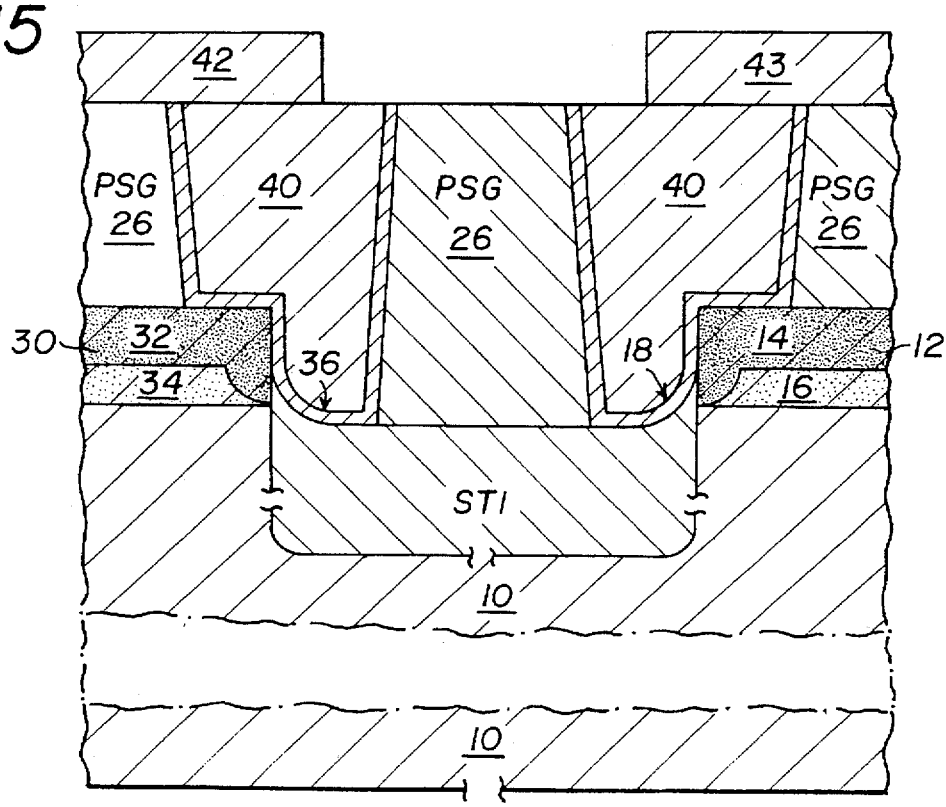
FIG. 15 represents a cross-sectional side view of two low-leakage contacts coupling metallization layers and oppositely doped diffusion regions which are located at distant portions of the semiconductor substrate.
Figure 16:
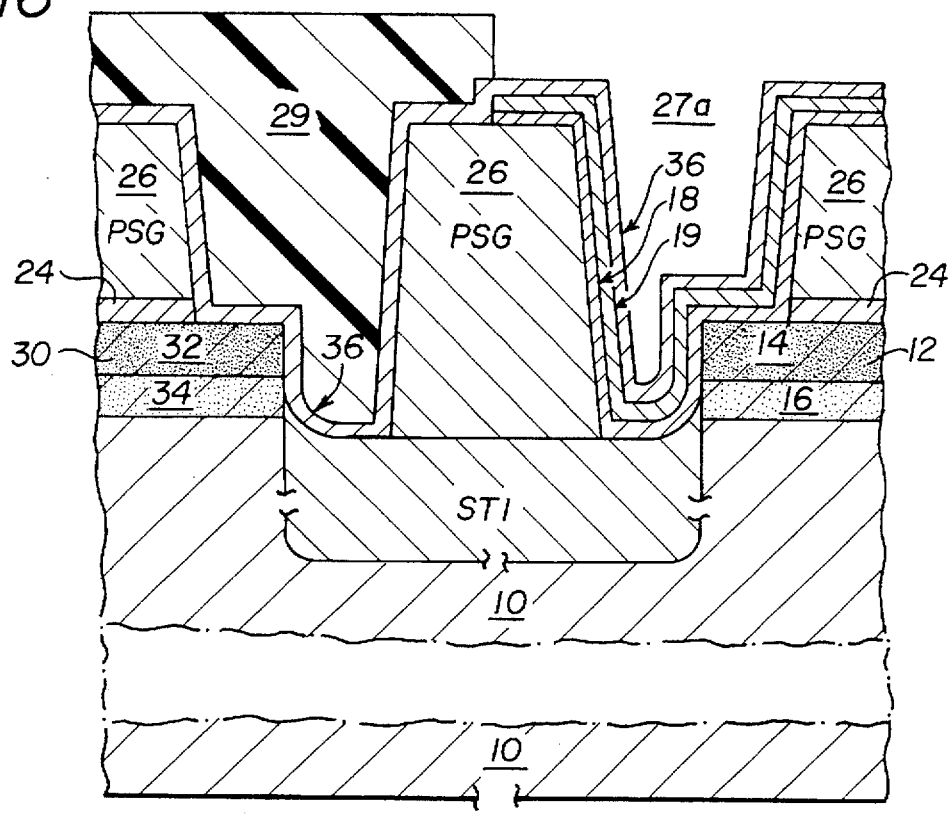
FIGS. 16–17 represent cross-sectional side views of structures formed in the fabrication by an alternative approach of the device of FIG. 15.
Figure 17:
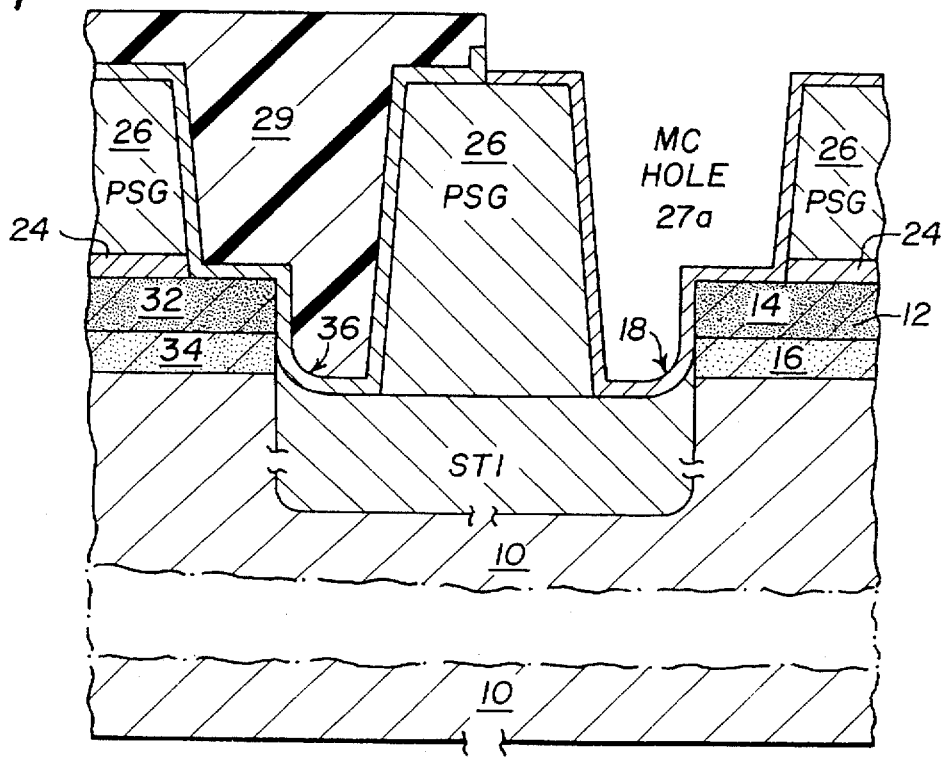

In the event the second electronic element 30 may similarly have exposed lightly doped areas 34 (see FIG. 13) causing leaky MC connection points it is possible to integrate stabilization of these contact points with the processes described above. Starting with the structure shown in FIG. 6 and in reference to FIGS. 6 and 13, electronic element 30 has highly doped areas 32 (as shown in FIG. 13) and lightly doped areas 34 (as shown in FIG. 13). After removal of the first dopant layer 18 from adjacent the second electronic element 30 and with the first electronic element 12 remaining protected by existing masking layer 28, a second dopant layer 36 may be conformally deposited over the device. The second dopant layer 36 is selected to have a similar type dopant as the second electronic element 30. For example, the first electronic element 12 may comprise an n-type diffusion, the second electronic element 30 a p-type diffusion and the second dopant layer 36 a highly doped layer of p+ polysilicon. The masking layer 28 and the second dopant layer 36 there over may then be removed by means well known in the art, resulting in the structure shown in FIG. 14. The first and second dopant layers may be annealed and then the metallization contacts 40 and metallization layers 42 and 43 formed as described above, resulting in the structure shown in FIG. 15.

Where multiple electronic elements may suffer leaky MC connection points the process of stabilizing the connection points may be similarly integrated with the processes described hereinabove. Starting with the structure of FIG. 11, and referring to FIGS. 11 and 16, wherein electronic element 30 has a highly doped region 32 (as shown in FIG. 16) and a lightly doped region 34 (as shown in FIG. 16), a second dopant layer 36 may be conformally deposited over the semiconductor device, including over the protective layer 19 in place over the first dopant layer 18 and electronic element 12. A second masking layer 29 may then be formed to selectively protect the second electronic element 30, leaving exposed the contact opening 27a adjacent first electronic element 12. The resulting structure is shown in FIG. 16. The exposed second dopant layer 36 and the protective layer 19 may then be removed from contact opening 27a as above by application of a KOH/alcohol etch and then dilute HF, resulting in the structure shown in FIG. 17. Then the masking layer 29 protecting the second electronic element 30 may be removed, thereby forming the structure shown in FIG. 14. The first dopant layer 18 and second dopant layer 36 over the passivation layer 26 may then be removed by CMP or other means known in the art. Both dopant layers 18 and 36 within the respective contact openings may be activated by the annealing process, followed by formation of contacts 40 and metallization layers 42 and 43 as discussed above.

Figure 18:
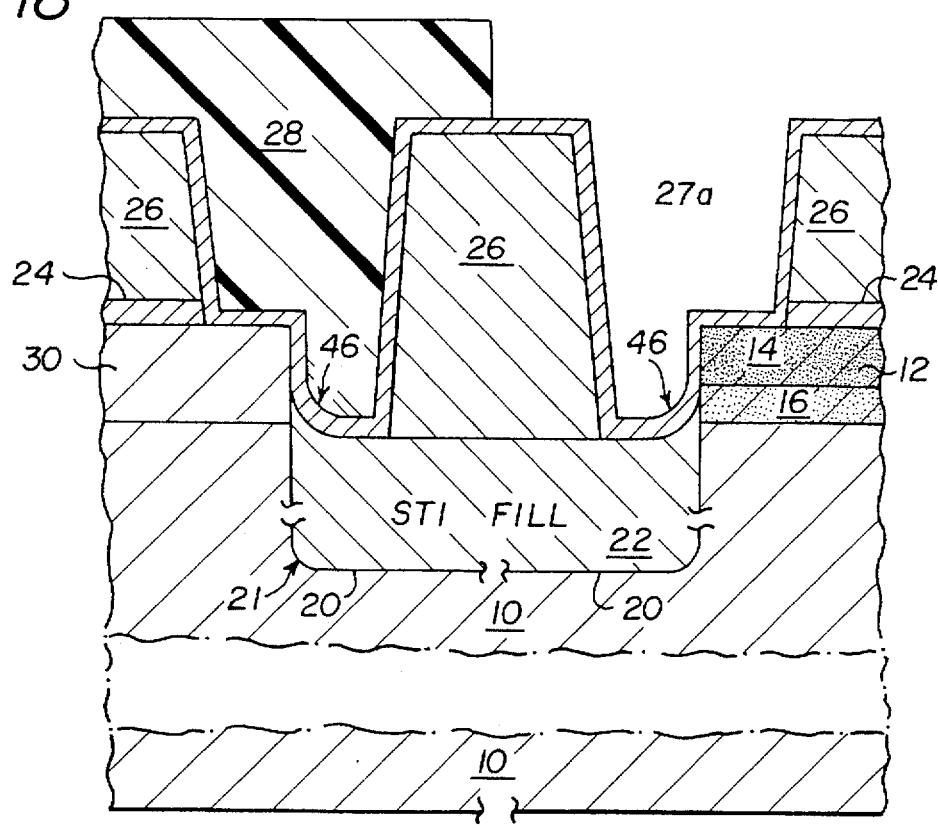
FIGS. 18–20 represent cross-sectional side views of structures formed in the fabrication by another alternative approach of the device of FIG. 1.
Figure 19:
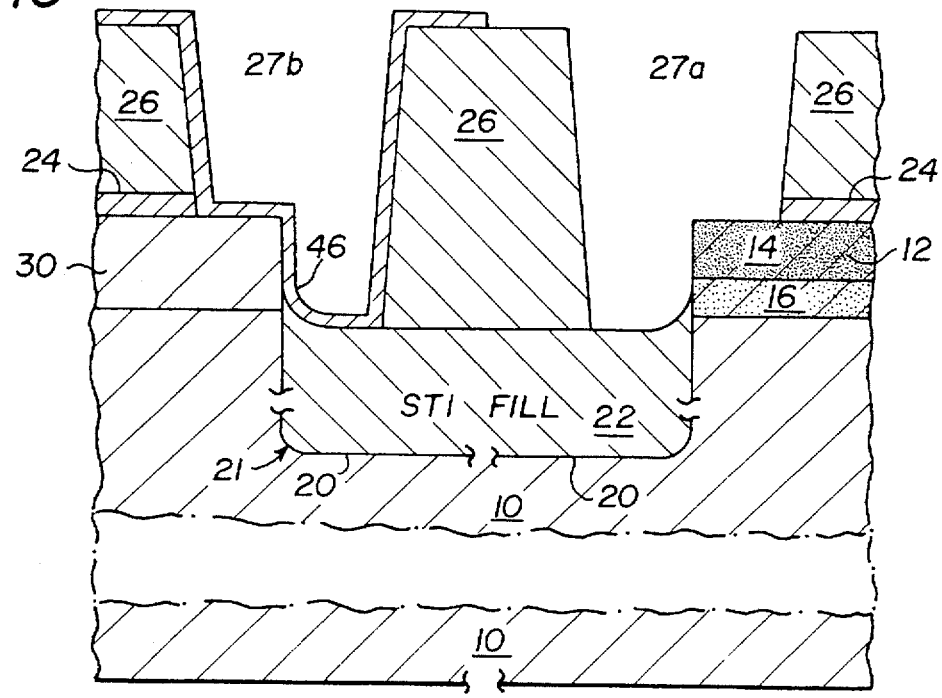
Figure 20:
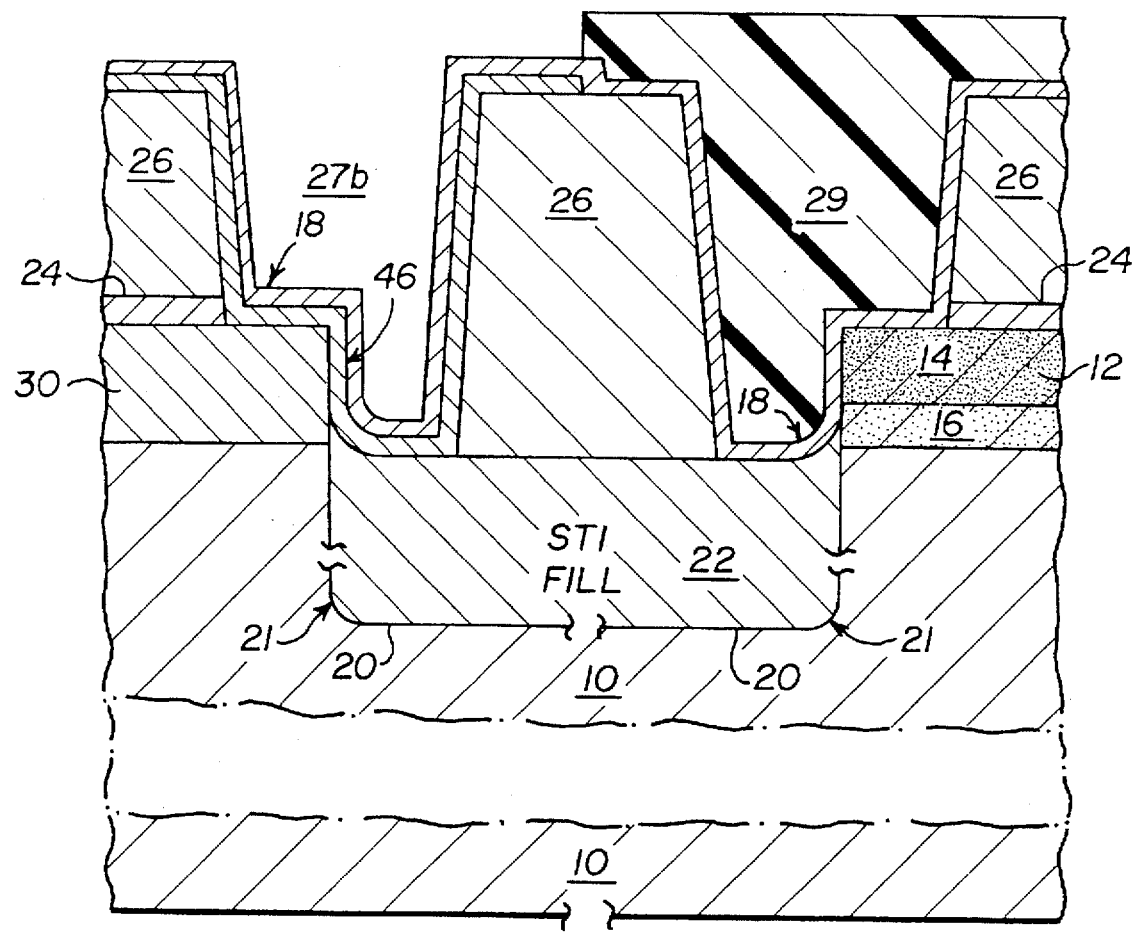

In the event the semiconductor device is likely to have only lightly doped p+ regions exposed by the contact openings an alternative process is preferred. Starting with the structure shown in FIG. 3, wherein the first electronic element 12 comprises a p+ diffusion region, a thin protective layer 46 may be conformally deposited over the semiconductor device followed by forming a first masking layer 28 that selectively protects the second electronic element 30, the resulting structure being shown in FIG. 18. The protective layer 46 may be of similar thickness and composition as the protective layer 19 discussed above. As may be seen in FIG. 19, the exposed protective layer 46 adjacent the first electronic element 12 may then be removed with dilute HF followed by removal of the first masking layer 28. A first dopant layer 18 of highly doped p+ polysilicon may then be conformally deposited over the device followed by depositing and patterning a second masking layer 29 to selectively protect the dopant layer 18 adjacent the first electronic element 12, resulting in the structure shown in FIG. 20. The exposed first dopant layer 18 over the second electronic element 30 may be removed with a KOH/alcohol etch, followed by removal of the protective layer 46 adjacent the second electronic element 30 by application of dilute HF. Thereafter, the second masking layer 29 may be removed, the device subjected to a short annealing cycle, and the contacts and metallization layers formed as discussed above in order to form the device as shown in FIG. 1.

While the present invention has been particularly shown and described with reference to the preferred embodiments thereof, it will be understood to those skilled in the art the various changes in form and details may be made therein without departing from the spirit and scope of the invention.

What is claimed is:

1. A semiconductor device having a low leakage contact comprising:

a semiconductor substrate having first and second electronic elements, said first electronic element having a lightly doped region;

a passivation layer over said semiconductor substrate, said passivation layer having first and second vias adjacent said first and second electronic elements respectively, said vias being filled with a conductive material;

a first dopant layer having a similar dopant-type as said first electronic element, said dopant layer positioned within said first via between said lightly doped region of said first electronic element and the conductive material in said first via, a portion of said first dopant layer being located at a level below an upper surface of said lightly doped region, said portion not directly contacting said lightly doped region; and a first intervening region located in said first electronic element between said portion of said first dopant layer and a proximate side of said lightly doped region, said intervening region having a higher level of dopant of said similar dopant-type than said lightly doped region.

2. The semiconductor device of claim 1, wherein said second electronic element has a lightly doped region of a dopant-type opposite said first electronic element, further comprising:

a second dopant layer having a similar dopant-type as said second electronic element, said second dopant layer positioned within said second via between said lightly doped region of said second electronic element and the conductive material in said second via, a portion of said second dopant layer being located at a level below an upper surface of said lightly doped region of said second electronic element, said portion of said second dopant layer not directly contacting the lightly doped region of said second electronic element.

3. The semiconductor device of claim 2 further including a second intervening region located in said second electronic device between said portion of said second dopant layer and a proximate side of said lightly doped region of said second electronic element, said second intervening region having a higher level of dopant of said opposite dopant-type than said lightly doped region of said second electronic element.

4. A semiconductor device having a low leakage contact comprising:

a semiconductor substrate having a first electronic element, said first electronic element having a lightly doped region;

a passivation layer over said semiconductor substrate, said passivation layer having a via adjacent said first electronic element, said via being filled with a conductive material;

a first dopant layer having a similar dopant-type as said first electronic element, said dopant layer positioned within said via between said lightly doped region of said first electronic element and said conductive material, a portion of said first dopant layer being located at a level below an upper surface of said lightly doped region, said portion not directly contacting said lightly doped region; and a first intervening region located in said first electronic element between said portion of said first dopant layer and a proximate side of said lightly doped region, said intervening region having a higher level of dopant of said similar dopant-type than said lightly doped region.

5. A semiconductor device having a low leakage contact comprising:

a semiconductor substrate having a first electronic element, said first electronic element having a lightly doped region;

a passivation layer over said semiconductor substrate, said passivation layer having a via adjacent said first electronic element, said via being filled with a conductive material;

a first dopant layer having a similar dopant-type as said first electronic element, said dopant layer positioned within said via between s aid lightly doped region of said first electronic element and said conductive material, a portion of said first dopant layer being located at a level below an upper surface of said is doped region;

a first intervening region located in said first electronic element between said portion of said first dopant layer and a proximate side of said lightly doped region, said intervening region having a higher level of dopant of said similar dopant-type than said lightly doped region; and wherein said conductive material extends to a level below the upper surface of said lightly doped region; and said portion of said first dopant layer does not directly contact said lightly doped region.

* * * * *

UNITED STATES PATENT AND TRADEMARK OFFICE
CERTIFICATE OF CORRECTION

PATENT NO. : 5,894,169
DATED : April 13, 1999
INVENTOR(S) : Givens et al.

It is certified that error appears in the above-identified patent and that said Letters Patent is hereby corrected as shown below:

IN THE ABSTRACT:

Line 7, delete "element diffusing" and replace with --element, diffusing--.

Col. 2, line 14, delete "contact-holes" and replace with --contact holes--.

Col. 2, line 22, delete "salicide" and replace with --salicided--.

Col. 3, line 43, delete "regions" and replace with --region--.

Claim 5, Col., 10, line 29, delete "s aid" and replace with --said--.

Signed and Sealed this

Twenty-fourth Day of August, 1999

Attest:

Q. TODD DICKINSON

*Attesting Officer*  *Acting Commissioner of Patents and Trademarks*